United States Patent

Liu et al.

Patent Number: 6,146,997
Date of Patent: Nov. 14, 2000

[54] METHOD FOR FORMING SELF-ALIGNED CONTACT HOLE

[75] Inventors: Jacson Liu, Hsinchu Hsien; Jing-Xian Huang, Hsinchu, both of Taiwan

[73] Assignee: Mosel Vitelic, Inc., Hsinchu, Taiwan

[21] Appl. No.: 09/407,268

[22] Filed: Sep. 29, 1999

[30] Foreign Application Priority Data

May 11, 1999 [TW] Taiwan .................................. 88107602

[51] Int. Cl.[7] ............................................. H01L 21/4763
[52] U.S. Cl. ........................ 438/639; 438/639; 438/253; 438/631; 438/626; 438/634; 257/336; 257/344; 257/346; 357/15; 357/59; 357/67
[58] Field of Search ............................. 257/336, 344, 257/346; 357/59, 15, 67; 438/253, 631, 626, 634

[56] References Cited

U.S. PATENT DOCUMENTS

| | | | |
|---|---|---|---|
| 4,675,715 | 6/1987 | Lepselter et al. | 357/59 |
| 5,436,188 | 7/1995 | Chen | 437/52 |
| 5,545,579 | 8/1996 | Liang et al. | 437/44 |
| 5,623,153 | 4/1997 | Liang et al. | 257/336 |
| 5,734,185 | 3/1998 | Iguchi et al. | 257/336 |
| 5,753,547 | 5/1998 | Ying | 438/253 |

*Primary Examiner*—David Nelms
*Assistant Examiner*—Phuc Dang
*Attorney, Agent, or Firm*—Morrison & Foerster LLP

[57] ABSTRACT

A simplified method for forming a self-aligned contact hole is disclosed. The method comprises the steps of (a) providing a semiconductor substrate having a gate electrode and a diffusion region thereon; (b) forming a conformal layer of etch barrier material overlying the substrate surface including the diffusion region and the upper surface and the sidewalls of the gate electrode; (c) forming an insulating layer overlying the barrier layer; (d) etching an opening through the insulating layer self-aligned and borderless to the diffusion region by using the barrier layer as an etch stop; and (e) anisotropically etching the barrier layer underneath the opening, thereby exposing the diffusion region and simultaneously forming a spacer of the etch barrier material on the sidewall of the gate electrode.

14 Claims, 5 Drawing Sheets

METHOD FOR FORMING SELF-ALIGNED CONTACT HOLE

BACKGROUND OF THE INVENTION

1. Field of the Invention

The present invention relates in general to the fabrication of semiconductor devices, and more particularly to a simplified method for forming a self-aligned contact hole.

2. Description of the Related Arts

Self-alignment is a technique in which multiple levels of regions on the wafer are formed using a single mask, thereby eliminating the alignment tolerance required by additional masks. This powerful approach is being used more often as circuit sizes decrease. Self-aligned contacts are often used in memory cells where contacts are limited only by the spacers and field oxide bird's beak or a contact window landing pad. Therefore, the mask contact window can be oversized relative to the contact area underneath, and no contact borders are needed, resulting in significant space saving. Referring to FIGS. 1A–1E, a conventional process of forming a self-aligned contact hole is illustrated in cross-sectional views. The process will be described as follows.

FIG. 1A shows a semiconductor substrate 10 having two closely spaced field effect transistors with gate electrodes 14, source/drain diffusion regions 18, and gate oxides 12. The gate electrodes 14, commonly consisting of polysilicon and silicide, are capped with an insulator 16 of silicon nitride. Next, a thin oxide layer 20 is formed over the substrate surface and on the sidewalls of the gate electrode 14 by rapid thermal oxidation at about 800 to 1100° C.

Referring to FIG. 1B, a conformal layer of silicon nitride 22 having a thickness of about 100 to 600 Å is deposited over the substrate surface using low pressure chemical vapor deposition (LPCVD). The conformal silicon nitride layer 22 is anisotropically etched to form nitride spacers 22a on the sidewalls of the gate electrodes 22 and the cap layers 16, as shown in FIG. 1C. Then, the thin oxide layer on the substrate surface is removed by HF solution to expose the diffusion region 18.

Referring to FIG. 1D, a conformal layer of etch barrier material 24 is deposited over the diffusion region 18, the cap layers 16, and the sidewall spacers 22a. The barrier layer is typically a silicon nitride layer having a thickness of about 100 to 500 Å. A layer of insulator 26 is deposited over the substrate as inter-layer dielectric (ILD) and is preferably planarized. The insulating layer 26 may consist of one or more dielectric depositions of spin on glass (SOG), silicon oxide, borophosphosilicate (BPSG), and so on.

Referring to FIG. 1E, using a photoresist mask 28, a contact hole 29 is etched in the insulating layer 26 with the barrier layer 24 serving as an etch stop, which is finally removed to expose the diffusion region 18. The etching of the insulating layer 26 is selective to the capping layers 16 and sidewall spacers 22a encapsulating the gate electrodes 14 so that the contact hole is self-aligning in nature.

The fabricating method described above, however, requires complicated processes. For example, two depositions of silicon nitride are required for forming the conformal layer 22 and the barrier layer 24, respectively. Besides, the two layers are to be etched individually. The conformal nitride layer 22 is etched to form nitride spacers 22a, and the barrier layer 24 is etched to reveal the underlying diffusion region 18 after the contact hole etching. Thus, improvements are needed to eliminate process steps so as to reduce the manufacturing cost and to increase the throughput.

SUMMARY OF THE INVENTION

It is therefore an object of the invention to provide a simplified method for forming a self-aligned contact hole.

To accomplish the above objective, the present invention provides a method for forming a self-aligned contact hole. In this method, the conformal layer used for forming sidewall spacers of gate electrodes will not be etched until a contact opening is formed, such that the conformal layer can serve as an etch barrier that protects the diffusion region during the contact hole etching. Thus, there is no need for depositing another etch barrier layer. Furthermore, the etching for sidewall spacers can be thus incorporated into the contact hole etching, thereby eliminating process steps.

The present method for forming a self-aligned contact includes the steps of: (a) providing a semiconductor substrate having a gate electrode and a diffusion region thereon; (b) forming a conformal layer of etch barrier material overlying the substrate surface including the diffusion region and the upper surface and the sidewalls of the gate electrode; (c) forming an insulating layer overlying the barrier layer; (d) etching an opening through the insulating layer self-aligned and borderless to the diffusion region by using the barrier layer as an etch stop; and (e) anisotropically etching the barrier layer underneath the opening, thereby exposing the diffusion region and simultaneously forming a spacer of the etch barrier material on the sidewall of the gate electrode.

Other objects, features, and advantages of the present invention will become apparent from the following detailed description which makes reference to the accompanying drawings.

DESCRIPTION OF THE PREFERRED EMBODIMENTS

Now in keeping with the objective of this invention, the method for fabricating a self-aligned contact hole is described in detail.

Figure 2A:
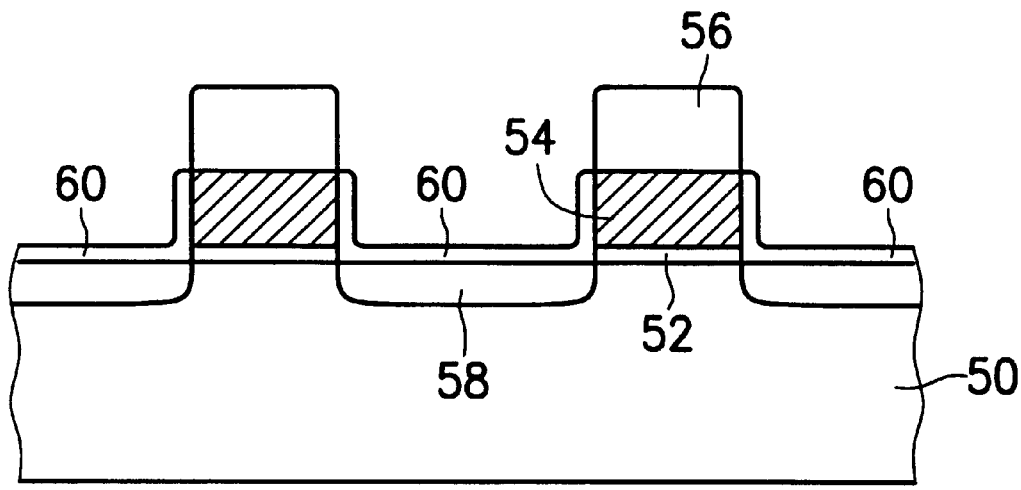
FIGS. 2A through 2D are cross-sectional views illustrating the steps for fabricating a self-aligned contact hole according to a preferred embodiment of the invention.

Referring to FIG. 2A, two closely spaced field effect transistors with gate electrodes 54, source/drain diffusion regions 58, and gate oxides 52 are defined in a semiconductor substrate 50 using known processes. The gate electrodes 54, preferably consisting of polysilicon and tungsten silicide, are capped with an insulator 56 of silicon nitride. The process details for forming such field effect transistors are well known and will not be described here. Next, a thin oxide layer 60 having a thickness of about 150 Å is formed over the substrate surface and on the sidewalls of the gate electrode 54 by rapid thermal oxidation at about 800 to 1100° C.

Figure 2B:
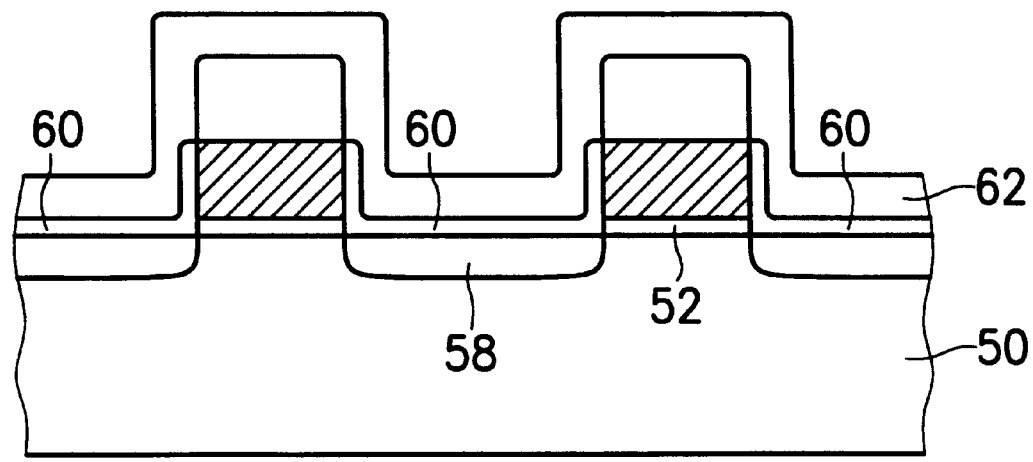

Referring to FIG. 2B, a conformal layer of silicon nitride 62 is deposited over the substrate surface using low pressure chemical vapor deposition (LPCVD). The conformal silicon nitride layer 62, as described earlier, acts as sidewall spacers of gate electrode 54 as well as an etch stop at contact hole etching. The conformal layer 62 preferably has a thickness of about 100 to 500 Å, and more preferably has a thickness of about 200 to 350 Å.

Figure 2C:
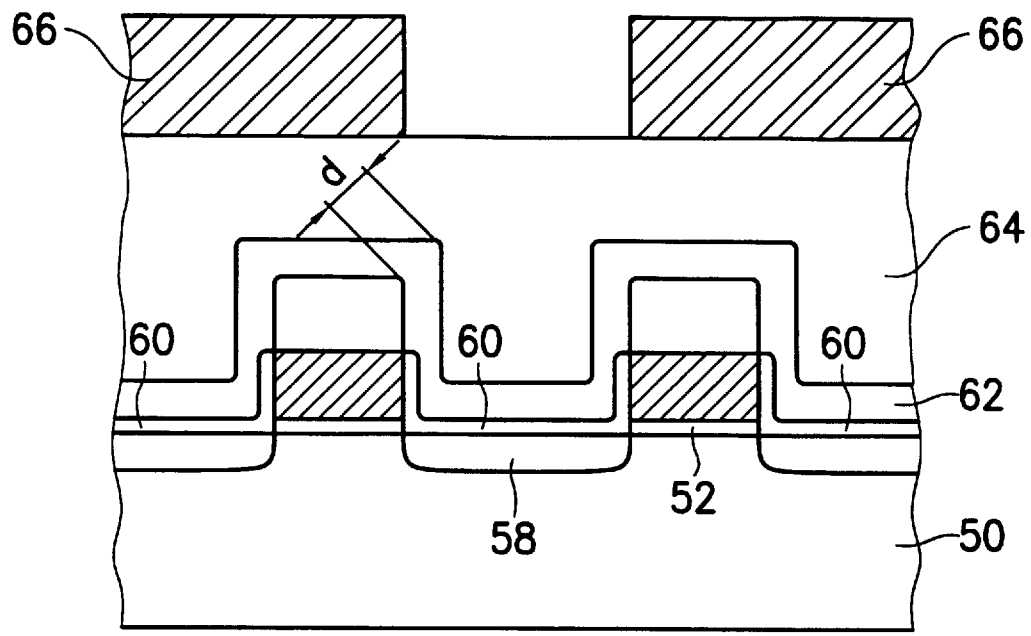

Referring to FIG. 2C, a layer of insulator 64 is deposited over the substrate as inter-layer dielectric (ILD) and is preferably planarized. The insulating layer 64 may consist of one or more dielectric depositions of spin on glass (SOG), silicon oxide, borophosphosilicate (BPSG), and the like. It should be particularly noted that the process steps of anisotropically etching for sidewall spacers and depositing a barrier layer necessary in the conventional method are omitted here.

Figure 1A:
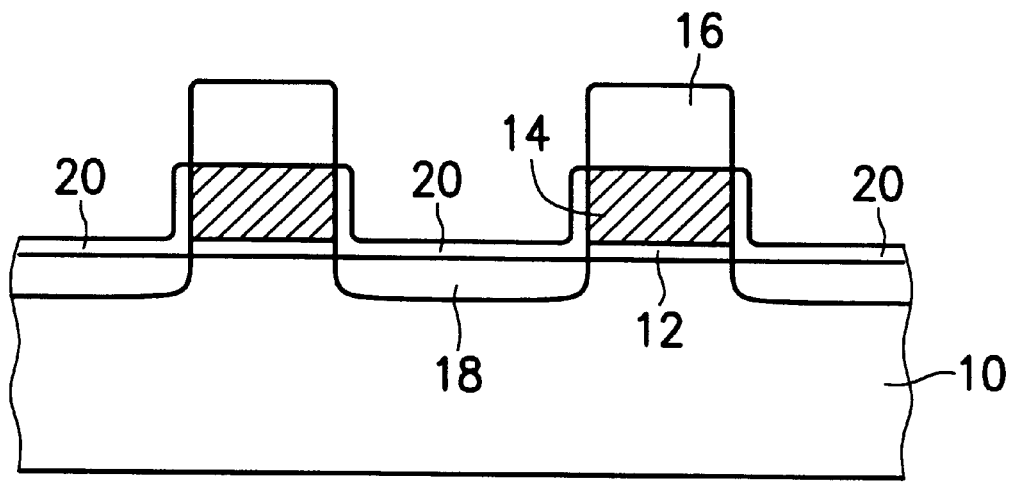
FIGS. 1A through 1E are cross-sectional views illustrating the steps of a conventional method for fabricating a self-aligned contact hole.
Figure 1B:
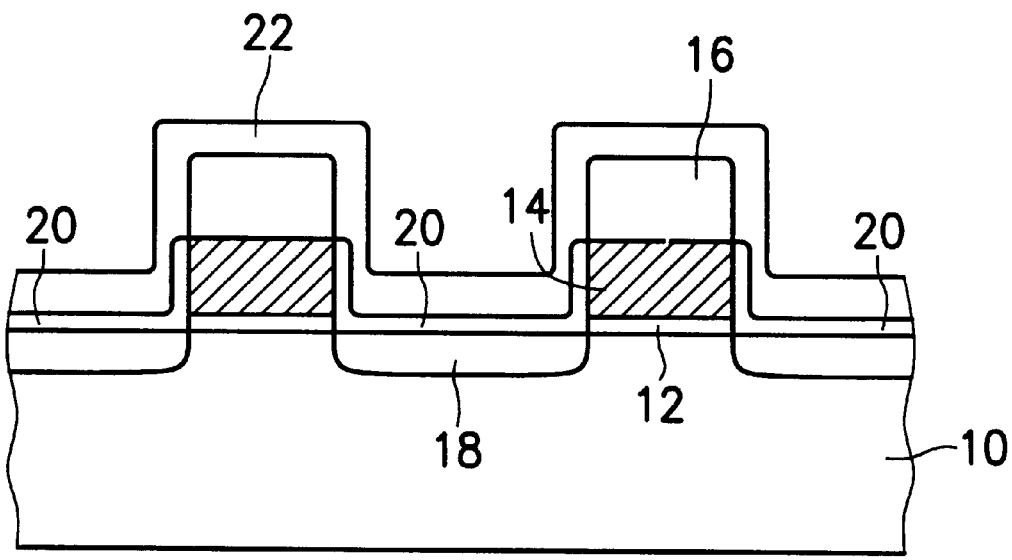
Figure 1C:
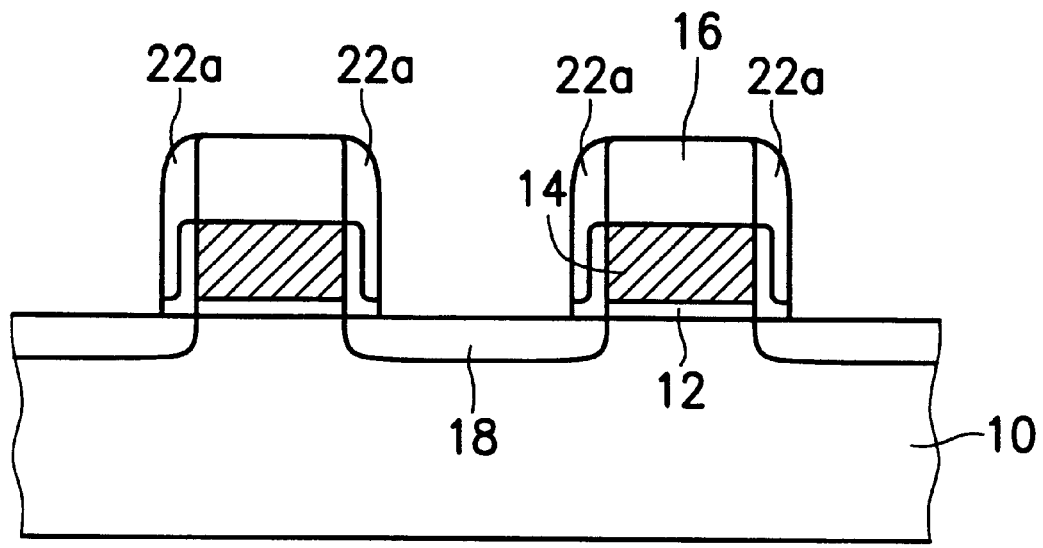
Figure 1D:
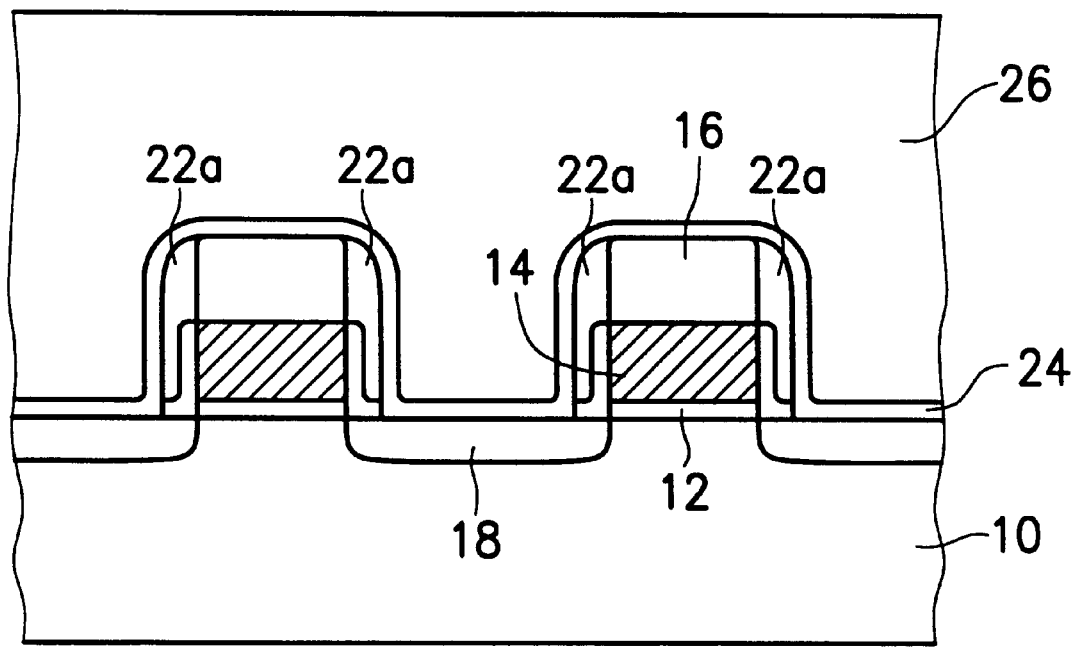
Figure 1E:
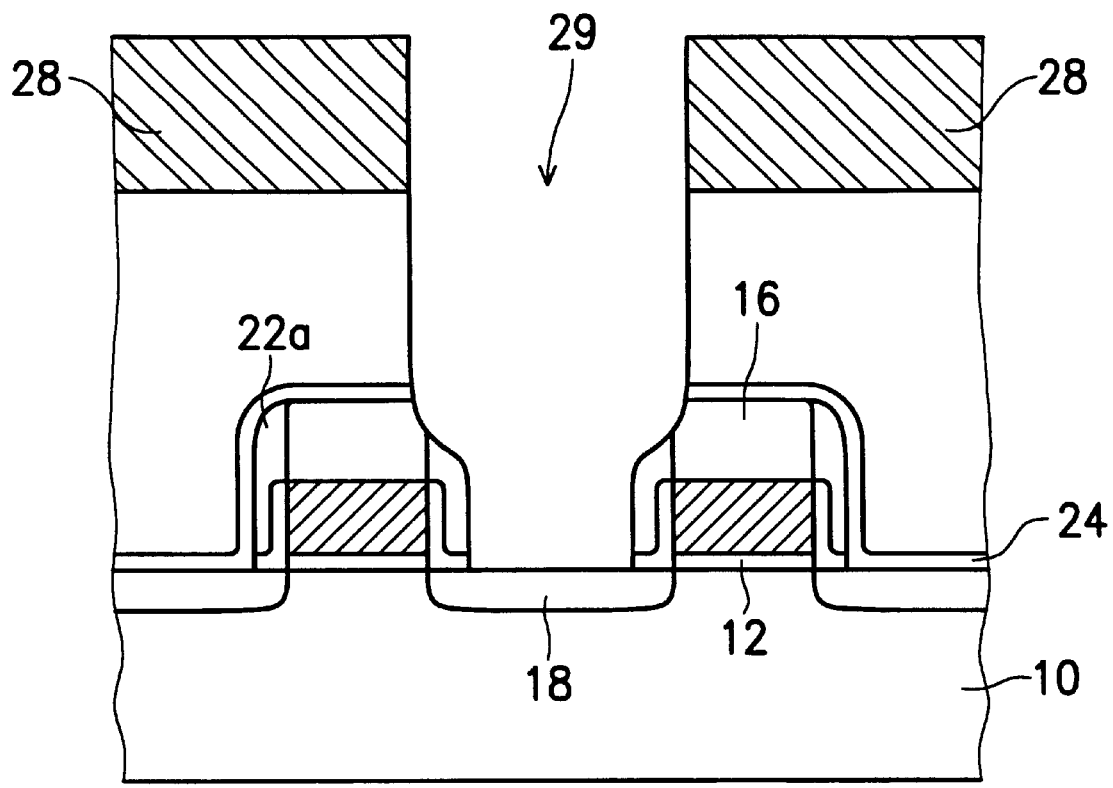
Figure 2D:
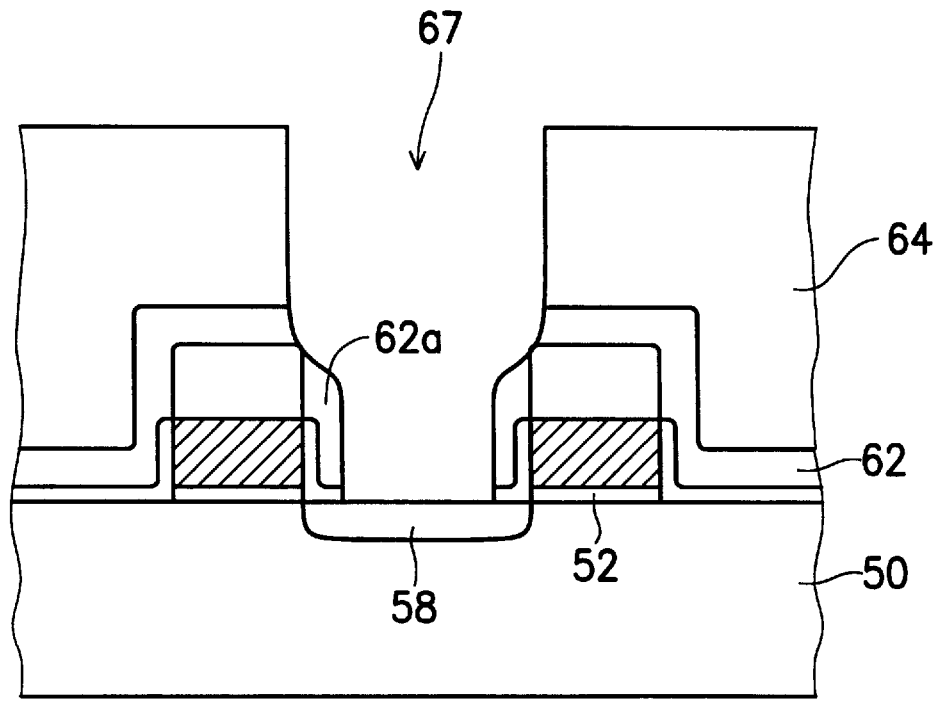

Referring to FIG. 2D, using a photoresist mask 66, a contact hole 67 is etched in the insulating layer 64 in a self-aligned manner. During this etch, the conformal nitride layer 62 serves as an etch barrier to protect the diffusion region 58 from being attacked by etching. Moreover, as depicted in FIG. 2C, it provides extra thickness d to protect the gate electrode 54 when compared to that of the conventional method (see FIG. 1C for reference). Next, the conformal nitride layer 62 underneath the opening is anisotropically etched to remove the portion over the diffusion region 58. Simultaneously with this etch, nitride spacers 62a are formed on sidewalls of the gate electrode 54. After removing the photoresist 66, the thin oxide layer 60 is removed by HF solution to expose the diffusion region 58, thereby completing the contact hole.

Thereafter, a conductive plug can be formed in the contact hole 67 to electrically connect to the diffusion region 58. The conductive plug is preferably chosen from polysilicon, tungsten, molybdenum, aluminum alloys, copper alloys, and the like. It can be formed by overfilling the contact hole and removing the conductive material outside of the contact hole by etch back or chemical mechanical polishing.

According to a feature of the present invention, because the conformal nitride layer 62 is not etched until the contact opening is formed, it provides extra thickness d to protect the gate electrode 54 at the contact hole etching. Further, the same nitride layer is anisotropically etched to form sidewall spacers that prevent shorting between the gate electrode and the conductive plug.

The simplified method of the invention overall reduces one etch step and one deposition step as compared to the conventional method illustrated by FIGS. 1A through 1E. Accordingly, the manufacturing cost is reduced and the throughput is increased. Further, since the method of the present invention provides a better etch barrier at the contact hole etching, it is advantageous in process tolerance and reliability.

While the invention has been particularly shown and described with the reference to the preferred embodiment thereof, it will be understood by those skilled in the art that various changes in form and details may be made without departing from the spirit and scope of the invention.

What is claimed is:

1. A method for forming a self-aligned contact hole, comprising the steps of:
   (a) providing a semiconductor substrate having a gate electrode and a diffusion region thereon;
   (b) forming a conformal layer of etch barrier material overlying the substrate surface including the diffusion region and the upper surface and the sidewalls of the gate electrode;
   (c) forming an insulating layer overlying the barrier layer;
   (d) etching an opening through the insulating layer self-aligned and borderless to the diffusion region by using the barrier layer as an etch stop; and
   (e) anisotropically etching the barrier layer underneath the opening, thereby exposing the diffusion region and simultaneously forming a spacer of the etch barrier material on the sidewall of the gate electrode.

2. The method as claimed in claim 1, further comprising a step of forming an oxide layer over the diffusion region and on the sidewalls of the gate electrode by thermal oxidation prior to forming the barrier layer.

3. The method as claimed in claim 1, wherein said gate electrode comprises a capping layer of silicon nitride.

4. The method as claimed in claim 1, wherein said barrier layer is a silicon nitride layer.

5. The method as claimed in claim 4, wherein said barrier layer has a thickness between about 100 to 500 Å.

6. The method as claimed in claim 1, wherein said insulating layer comprises a layer of borophosphosilicate glass.

7. The method as claimed in claim 1, wherein step (c) comprises:
   depositing an insulating layer overlying the barrier layer; and
   planarizing the insulating layer.

8. The method as claimed in claim 1, further comprising forming a conductive plug in said opening to electrically connect to the diffusion region.

9. A method for forming a self-aligned contact hole, comprising the steps of:
   (a) providing a semiconductor substrate having a gate electrode and a diffusion region thereon, said gate electrode comprising a capping layer;
   (b) forming an oxide layer over the diffusion region and on the sidewalls of the gate electrode by thermal oxidation;
   (c) forming a conformal layer of silicon nitride overlying the substrate surface including the diffusion region and the upper surface and the sidewalls of the gate electrode;
   (d) forming an insulating layer overlying the conformal layer of silicon nitride;
   (e) etching an opening through the insulating layer self-aligned and borderless to the diffusion region by using the silicon nitride layer as an etch stop; and
   (e) anisotropically etching the silicon nitride layer underneath the opening, thereby exposing the diffusion region and simultaneously forming a spacer of silicon nitride on the sidewall of the gate electrode.

10. The method as claimed in claim 9, wherein said capping layer is a silicon nitride layer.

11. The method as claimed in claim 9, wherein said conformal layer of silicon nitride has a thickness between about 100 to 500 Å.

12. The method as claimed in claim 9, wherein said insulating layer comprises a layer of borophosphosilicate glass.

13. The method as claimed in claim 9, wherein step (d) comprises:
   depositing an insulating layer overlying the conformal layer of silicon nitride; and
   planarizing the insulating layer.

14. The method as claimed in claim 9, further comprising forming a conductive plug in said opening to electrically connect to the diffusion region.

* * * * *